US006446027B1

United States Patent
O'Keeffe et al.

(10) Patent No.: US 6,446,027 B1
(45) Date of Patent: Sep. 3, 2002

(54) INTELLIGENT ANALYSIS SYSTEM AND METHOD FOR FLUID-FILLED ELECTRICAL EQUIPMENT

(75) Inventors: Thomas Gary O'Keeffe, Farmington; Gregory Dennis Coulter, Unionville, both of CT (US); Steven Hector Azzaro, Schenectady, NY (US); Vinay Bhaskar Jammu; Edward Brittain Stokes, both of Niskayuna, NY (US); John Charles Crouse, Rome, GA (US); Alfonso M. Delgado Cruz, Guadalupe; Enrique Betancourt, Monterrey, both of (MX)

(73) Assignees: General Electric Company, Schenectady, NY (US); Prolec-ge. S. de R.L. de C.V., Nuevo Leon (MX)

( * ) Notice: Subject to any disclaimer, the term of this patent is extended or adjusted under 35 U.S.C. 154(b) by 0 days.

(21) Appl. No.: 09/398,034

(22) Filed: Sep. 17, 1999

(51) Int. Cl.⁷ .................. G06F 17/00; G06F 101/14
(52) U.S. Cl. .................. 702/183; 702/181; 702/182; 702/184; 706/45; 706/50
(58) Field of Search .................. 702/181, 182, 702/183, 184, 185; 706/45, 50, 52; 700/275, 281, 282; 340/5.22, 5.23, 5.25

(56) References Cited

U.S. PATENT DOCUMENTS

| | | | |
|---|---|---|---|
| 3,855,503 A | | 12/1974 | Ristuccia |
| 4,644,479 A | * | 2/1987 | Kemper et al. ............. 702/185 |
| 4,654,806 A | * | 3/1987 | Poyser et al. |
| 5,400,018 A | * | 3/1995 | Scholl et al. .............. 340/10.3 |
| 5,845,272 A | * | 12/1998 | Morjaria et al. |
| 6,104,988 A | * | 8/2000 | Klarer ........................ 702/183 |

OTHER PUBLICATIONS

Kirtley, Jr., et al. "Monitoring the Health of Power Transformers"; IEEE Computer Applications in Power (Jan. 1996) pp. 18–23.

* cited by examiner

Primary Examiner—Bryan Bui
(74) Attorney, Agent, or Firm—Hunton & Williams (57) ABSTRACT

An intelligent analysis apparatus and method for fluid filled electrical equipment includes sensors for measuring various parameters of the electrical equipment. Analytical models calculate parameters based on measurements of other parameters. The measured and calculated parameters are compared and the result of the comparison is used as an indicator in a causal network. The probabilities of the causal network are recalculated by a belief network. The analytical models are adjusted over time to account for acceptable changes in behavior of the equipment over time. The output of the causal network can be used for diagnostic and prognostic indication.

36 Claims, 4 Drawing Sheets

INTELLIGENT ANALYSIS SYSTEM AND METHOD FOR FLUID-FILLED ELECTRICAL EQUIPMENT

BACKGROUND OF THE INVENTION

The invention relates generally to fluid-filled electrical equipment. More particularly, the invention relates to an apparatus and method for determining operating status, diagnostic status, and prognostics of electrical equipment in real time.

Electrical equipment, particularly medium-voltage or high-voltage electrical equipment, requires a high degree of electrical and thermal insulation between components thereof. Accordingly, it is well known to encapsulate components of electrical equipment, such as coils of a transformer, in a containment vessel and to fill the containment vessel with a fluid. The fluid facilitates dissipation of heat generated by the components and can be circulated through a heat exchanger to efficiently lower the operating temperature of the components. The fluid also serves as electrical insulation between components or to supplement other forms of insulation disposed around the components, such as cellulose paper or other insulating materials. Any fluid having the desired electrical and thermal properties can be used. Typically, electrical equipment is filled with an oil, such as castor oil, mineral oil, or vegetable oil, or a synthetic "oil", such as chlorinated diphenyl, silicone, or sulfur hexaflouride.

Often electrical equipment is used in a mission critical environment in which failure can be very expensive, or even catastrophic, because of a loss of electric power to critical systems. Also, failure of electrical equipment ordinarily results in a great deal of damage to the equipment itself and surrounding equipment thus requiring replacement of expensive equipment. Further, such failure can cause injury to personnel due to electric shock, fire, or explosion. Therefore, it is desirable to monitor the status of electrical equipment to predict potential failure of the equipment through detection of incipient faults and to take remedial action through repair, replacement, or adjustment of operating conditions of the equipment. However, the performance and behavior of fluid-filled electrical equipment inherently degrades over time. Faults and incipient faults should be distinguished from normal and acceptable degradation.

A known method of monitoring the status of fluid-filled electrical equipment is to monitor various parameters of the fluid. For example, the temperature of the fluid and the total combustible gas (TCG) in the fluid is known to be indicative of the operating state of fluid-filled electrical equipment. Therefore, monitoring these parameters of the fluid can provide an indication of any incipient faults in the equipment. For example, it has been found that carbon monoxide and carbon dioxide increase in concentration with thermal aging and degradation of cellulosic insulation in electrical equipment. Hydrogen and various hydrocarbons (and derivatives thereof such as acetylene and ethylene) increase in concentration due to hot spots caused by circulating currents and dielectric breakdown such as corona and arcing. Concentrations of oxygen and nitrogen indicate the quality of the gas pressurizing system employed in large equipment, such as transformers. Accordingly "dissolved gas analysis" (DGA) has become a well accepted method of discerning incipient faults in fluid-filled electric equipment.

In conventional DGA methods, an amount of fluid is removed from the containment vessel of the equipment through a drain valve. The removed fluid is then subjected to testing for dissolved gas in a lab or by equipment in the field. This method of testing is referred to herein as "off-line" DGA. Since the gases are generated by various known faults, such as degradation of insulation material or other portions of electric components in the equipment, turn-to-turn shorts in coils, overloading, loose connections, or the like, various diagnostic theories have been developed for correlating the quantities of various gases in fluid with particular faults in electrical equipment in which the fluid is contained.

However, since conventional methods of off-line DGA require removal of fluid from the electric equipment, these methods do not, 1) yield localized position information relating to any fault in the equipment, 2) account for spatial variations of gases in the equipment, and 3) provide real time data relating to faults. If analysis is conducted off site, results may not be obtained for several hours. Incipient faults may develop into failure of the equipment over such a period of time.

MICROMONITORS, INC™ and SYPROTEC™ have each developed a gas sensor which resides in the drain valve, or other single locations, of a transformer and overcomes some of the limitations of off-line DGA. However, location data relating to a fault is not discernable with such a device because it is located in one predefined position and does not provide any indication of the position of the source of the gas, i.e., the fault. U.S. Pat. No. 4,654,806 discloses an apparatus for monitoring transformers including sensors for detecting oil temperature, gas in oil, and cabinet temperature. Raw data from the sensors is collected by a microcomputer and periodically downloaded to remote host computer. The microcomputer can compare various measured parameters with predetermined thresholds and can activate alarms or other warnings if the thresholds are exceeded. The remote host computer can control a cooling system of the transformer based on the parameters that are periodically downloaded to the remote host computer. Similarly, U.S. Pat. No. 3,855,503 discloses a remotely monitored transformer in which data from sensors is downloaded to a remote computer and compared to predetermined thresholds. If the thresholds are exceeded, the transformer can be de-energized. U.S. Pat. No. 4,654,806 discloses that the individual thresholds can be varied based on other thresholds. However, the devices disclosed in U.S. Pat. No. 4,654,806 and U.S. Pat. No. 3,855,503 fall short of providing comprehensive and cohesive diagnostics in real time because they do not account for the complex relationships between the various operating parameters of fluid-filled electrical equipment or the normal degradation over time of fluid-filled electrical equipment. The article entitled "Monitoring the Health of Power Transformer" discusses research at Massachusetts Institute of Technology relating to model based diagnostic systems.

Known processes and apparatus do not provide accurate, real-time diagnosis of incipient faults in, and prognosis of, fluid-filled electrical equipment because the complex relationship between various operational parameters of fluid-filled electrical equipment is not addressed fully by the prior art. For example, a temperature rise outside of a normal range may be due to a temporary increase in load and not to an incipient fault. Other parameters are related in more complex ways that are not addressed by the prior art. Also, the devices discussed above do not account for dynamic change over time in transformer behavior.

U.S. Pat. No. 5,845,272 discloses a system for isolating failures in a locomotive or a process having a plurality of equipment. The system uses outputs from various sensors as inputs in a knowledge base including causal networks. However, U.S. Pat. No. 5,845,272 is not directed to diagnostics of fluid filled electrical equipment and thus does not take into account the complex relationships between parameters of fluid filled electrical equipment and the dynamic change in behavior of fluid-filled electrical equipment over time.

In summary, known processes and apparatus do not take into account analytical models of fluid-filled electrical equipment operation including thermal, fluid flow, electric field, pressure-volume, chemical, failure mode, root failure cause and gas-in-oil models, all of which are related in a complex manner and change over time. Therefore, known methods and apparatus do not accurately identify and predict failure modes and assess the life cycle of fluid-filled electrical equipment.

SUMMARY OF THE INVENTION

The invention relates to a diagnostic apparatus and method for electrical equipment. A first aspect of the invention is an intelligent analysis apparatus for fluid-filled electrical equipment of the type having components surrounded by fluid. The apparatus comprises plural sensors adapted to be coupled to fluid-filled electrical equipment and configured to output signals indicative of plural operating parameters of electrical equipment, and a diagnostic device coupled to the sensors and having a processor for determining operating characteristics of the electrical equipment based on at least one analytical model of the electrical equipment and the signals outputted by the sensors by applying values of parameters calculated by the at least one analytical model and values of parameters as indicated by the signals of the sensors in a causal network.

A second aspect of the invention is a method for intelligent analysis of fluid-filled electrical equipment of the type having components surrounded by fluid. The method comprises the steps of sensing plural operating parameters of electrical equipment having a containment vessel configured to contain a fluid and at least one electrical component disposed in the containment vessel, generating signals indicative of the plural operating parameters of the electrical equipment sensed in the sensing step, and determining operating characteristics of the electrical equipment based on at least one analytical model of the electrical equipment and the signals generated in the generating step by applying values of parameters calculated by the at least one analytical model and values of parameters as indicated by the signals generated in the generating step in a causal network.

BRIEF DESCRIPTION OF THE DRAWING

The present invention can be more fully understood upon reading the following detailed description of a preferred embodiment in conjunction with the accompanying drawing in which.

DETAILED DESCRIPTION OF THE PREFERRED EMBODIMENT

An embodiment of the invention uses analytical models of operation of fluid-filled electrical equipment in combination with causal networks for the purpose of determining operational status, diagnostics, and prognostics of fluid-filled electrical equipment. The analytical models can include models of thermal characteristics, electric and magnetic fields, temperature-pressure-volume, failure modes, root failure cause, gas in oil, and chemical composition. The analytical models are adjusted over time to account for behavioral changes in the fluid-filled electrical equipment. A belief network is used to dynamically adjust the parameters of the causal network.

Figure 1:
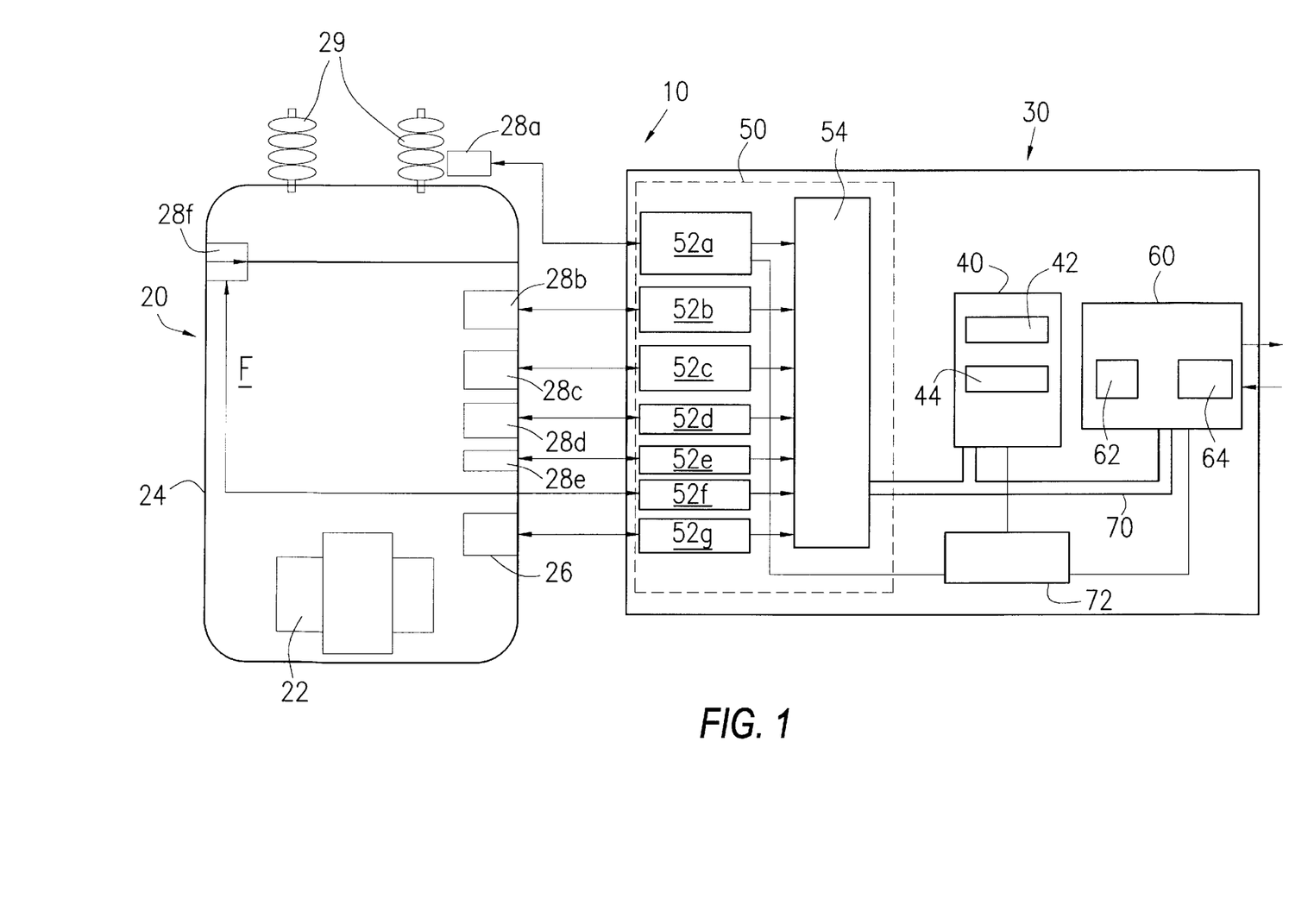
FIG. 1 is a schematic illustration of a preferred embodiment of the invention and associated electrical equipment.

FIG. 1 illustrates a preferred embodiment of the invention. Diagnostic system 10 comprises diagnostic device 30 adapted to be coupled to electrical equipment 20, an electrical transformer in the preferred embodiment. Electrical equipment 20 comprises electrical components 22, including a core and coils/windings of the transformer, and containment vessel 24 surrounding components 22. Containment vessel 24 is adapted to contain fluid F, such as oil, for cooling and insulating components 22. Fluid F can be pumped through containment vessel 24 and a radiator (not illustrated) by pump 26 disposed in or near containment vessel 24. The radiator serves as a heat exchanger to cool fluid F and to thereby conduct heat away from components 22 and can include any known form of pipes, conduits, heat exchanging surfaces, cooling elements, pumps, fans, or the like. Cooling can be accomplished through thermal convection, thermal conduction, molecular convection of fluid F, or in any other manner.

A plurality sensors 28a–28f are operatively coupled to electrical equipment 20 in an appropriate manner. Sensors 28a–28f can be of any appropriate type for sensing a desired parameter and generating, i.e. outputting, a signal indicative of the value of the sensed parameter. In the preferred embodiment, sensor 28a is a voltmeter, ammeter, or the like to measure the electrical load on electrical equipment 20 and is coupled to load terminals 29 of electrical equipment 20, sensor 28b is a temperature sensor disposed in fluid F inside containment vessel 24, sensor 28c is a pressure sensor disposed in fluid F inside containment vessel 24, sensor 28d is a molecular hydrogen sensor disposed in fluid F inside containment vessel 24, sensor 28e is a fluid circulation sensor, and sensor 28f is a fluid level sensor.

In the preferred embodiment, sensors 28b–28f are in contact with fluid F. However, the invention requires only that the sensors 28b–28f be capable of measuring parameters of fluid F. Accordingly, the sensors can be in a contact or non contact relationship with fluid F depending on the type of sensors used, as discussed in greater detail below. For example, sensors 28b–28f can be positioned remotely from fluid F and can have sensing elements disposed in fluid F. Alternatively, sensors 28a–28f can be entirely remote from fluid F and can monitor parameters in fluid F from a distance, such as through optical means or the like. Sensors 28a–28f can be disposed at any location and can sense parameters of electrical equipment 20 at any location as dictated by the type, size, and shape of electrical equipment 20, the diagnostics and prognostics to be evaluated, and any other details of the practical application. For example, it may be desirable to sense values of winding temperature, hot spot temperature, core temperature, on load tap changer (OLTC) temperature, ambient temperature, gas space pressure, fluid level, moisture in fluid, fluid dielectric strength, acoustic partial discharge, sound pressure in the equipment, ambient sound pressure, various gases in the fluid, fluid flow, fan/pump speeds and currents, load currents, line voltage, and vibration. All of these parameters can be sensed with known sensors. Further, plural sensors can be used to measure the same parameter simultaneously at more than one location. Of course, there can be any number of sensors depending on the parameters to be measured and the measurement locations desired.

Sensors 28a–28f can be fixedly disposed at the desired position on or in electrical equipment 20 or can be removably disposed at desired locations by being selectively inserted through sensor ports or other openings formed through walls of containment vessel 24 or other portions of electrical equipment 20. Sensors 28a–28f can be of any appropriate type. For example, each sensor 28b–28f can be one or more of metal insulator semiconductor diode sensors, fiber optic probes, acoustic or optical waveguides, bimetal sensors, thin film sensors, or any other appropriate sensor or transducer for measuring the parameters noted herein. Sensor 28a can be any known type of electrical load sensing device such as a resistive or inductive device. If sensors 28a–28f are electric or electronic in nature and disposed inside a high EM field region of electrical equipment 20, proper electrical shielding can be provided. Optical or other types of sensors need not be electrically shielded regardless of location. Sensors 28a–28f generate data or signals indicative of the operating parameters of electrical equipment 20 sensed thereby.

Diagnostic device 30 is coupled to electrical equipment 20 for determining various operating characteristics of electrical equipment 20 and comprises processor 40, input/output interface (I/O) 50, user interface 60, data bus 70 and power supply 72. Sensors 28a–28f and pump 26 are communicatively coupled to I/O 50 through an appropriate conducting mechanism. For example, if sensors 28a–28f are electronic or produce electronic signals, electric conductors can extend from sensors 28a–28f to I/O 50. The conductors can include any appropriate terminal strip, connector, or the like, for connection to I/O 50. Coupling, i. e. conducting signals, between sensors 28a–28f and I/O 50 can be accomplished by wires, fiber optic strands, radio frequency devices, infrared devices, or in any other known manner. Pump 26 can be coupled to I/O 50 in a similar manner. Diagnostic device 30 can communicate with sensors 28a–28f and pump 26 over a remote or local communication link, such as a phone line, an RS232 serial link, universal serial bus (USB) link, radio frequency link, infrared link, or the like. Power supply 72 is illustrated as a separate element. However, the power supply can be integral to one or more of the other components.

I/O 50 includes plural signal conditioning circuits 52a–52g which can be of any type appropriate for conditioning the signals or data output from sensors 28a–28f and pump 26. For example, signal conditioning circuits 52a–52g can include circuitry for smoothing, sampling, current limiting, choking, amplifying, attenuating, or other, functions in a known manner. Note that pump 26 can include a feedback capability to provide a signal or data representative of the operating status thereof, such as one or more of a tachometer feedback, vibration feedback, or load feedback. Similarly, each of signal conditioning circuits 52a–52g are capable of conditioning output signals to be sent to sensors 28a–28f and pump 26. Such signals can relate to adjustment of thresholds, linearization parameters, sensitivity adjustments, speed adjustments (in the case of pump 26), and the like as will be described further below. Signal conditioning circuits 52a–52g are illustrated as separate elements. However, one or more of the signal conditioning circuits can be integral to the sensor, the processor, or other components.

I/O 50 also includes a multiple channel digital to analog and analog to digital converter (D/A) 54 which provides an interface between the signals of sensors 28a–28f and pump 26, which are analog in the preferred embodiment, and processor 40, which is digital in the preferred embodiment. Of course, if sensors 28a–28f, pump 26 and processor 40 are all analog or all digital, D/A 54 can be omitted. D/A 54 is coupled to processor 40 through data bus 70 for two way communication. Processor 40 includes central processing unit (CPU) 42, and memory device 44. CPU 42 executes a control program stored in memory device 44. Memory device 44 can include a standard magnetic memory device, such as a hard disk, for storing the control program and other data and also includes a "work space", such a random access memory (RAM) for CPU 42 to store data temporarily.

Diagnostic device 30 can also include user interface 60 comprising display 62 and input device 64. Input device 64 can be any type of keyboard, mouse, switch or switches, or any other device for allowing the user to input settings, parameters, instructions, or the like to processor 30. Display 62 can be any type of display for indicating operating status, such as an LCD or CRT display, a pilot lamp or series of pilot lamps, an audible alarm, or the like. Power supply 72 provides power to other elements of diagnostic device 30 and can be any type of known power supply, such as a battery, a fuel cell, or a rectifier for providing DC power from an AC input. Diagnostic device 30 can be a microprocessor based device, such as a personal computer or programmable logic controller, a hardwired logic device, or any other device for accomplishing the requisite processing disclosed below.

Processor 40 contains a preprogrammed control program stored in memory device 44 for determining characteristics, such as diagnostics, prognostics, performance characteristics, and life assessment of electrical equipment 20 in the manner described below. Specifically, the control program includes various analytical models of behavior of electrical equipment 20, a causal network, and a belief network. Data bus 70 can utilize any appropriate type of hardware and/or software protocols for transmitting and receiving data or signals. For example, data bus 70 can be a standard ISA bus, DCI bus, GPIB bus, or the like. Data can be transmitted to and received from a remote or local host computer to provide further diagnostics, prognostics, and control and to coordinate diagnostics and operation of a plurality of fluid-filled electrical equipment.

In operation, containment vessel 24is fully or partially filled with fluid F, such as oil. In this state, sensors 28b, 28c, 28d, 28e and 28f are in contact with, or otherwise can sense parameters in, fluid P. In the preferred embodiment sensor 28b senses the temperature of fluid F, sensor 28c senses the pressure in fluid F, sensor 28d senses the content of molecular hydrogen in fluid F, sensor 28e senses circulation of fluid F, and sensor 28f senses the level of fluid F. Other sensed parameters can include, but are not limited to the content of various gases (such as acetylene, carbon, monoxide, and ethylene), winding temperature, hot spot temperature, core temperature, on-load top changer (OLTC) temperature, ambient temperature, gas space pressure, fluid level, moisture in fluid, fluid dielectric strength, acoustic partial discharge, sound pressure, ambient sound pressure, gas content, fluid flow, pump speed, and vibration. Of course, any parameter which is helpful in determining the operational status and/or is considered in an analytical model of electrical equipment 20 can be sensed.

Figure 2:
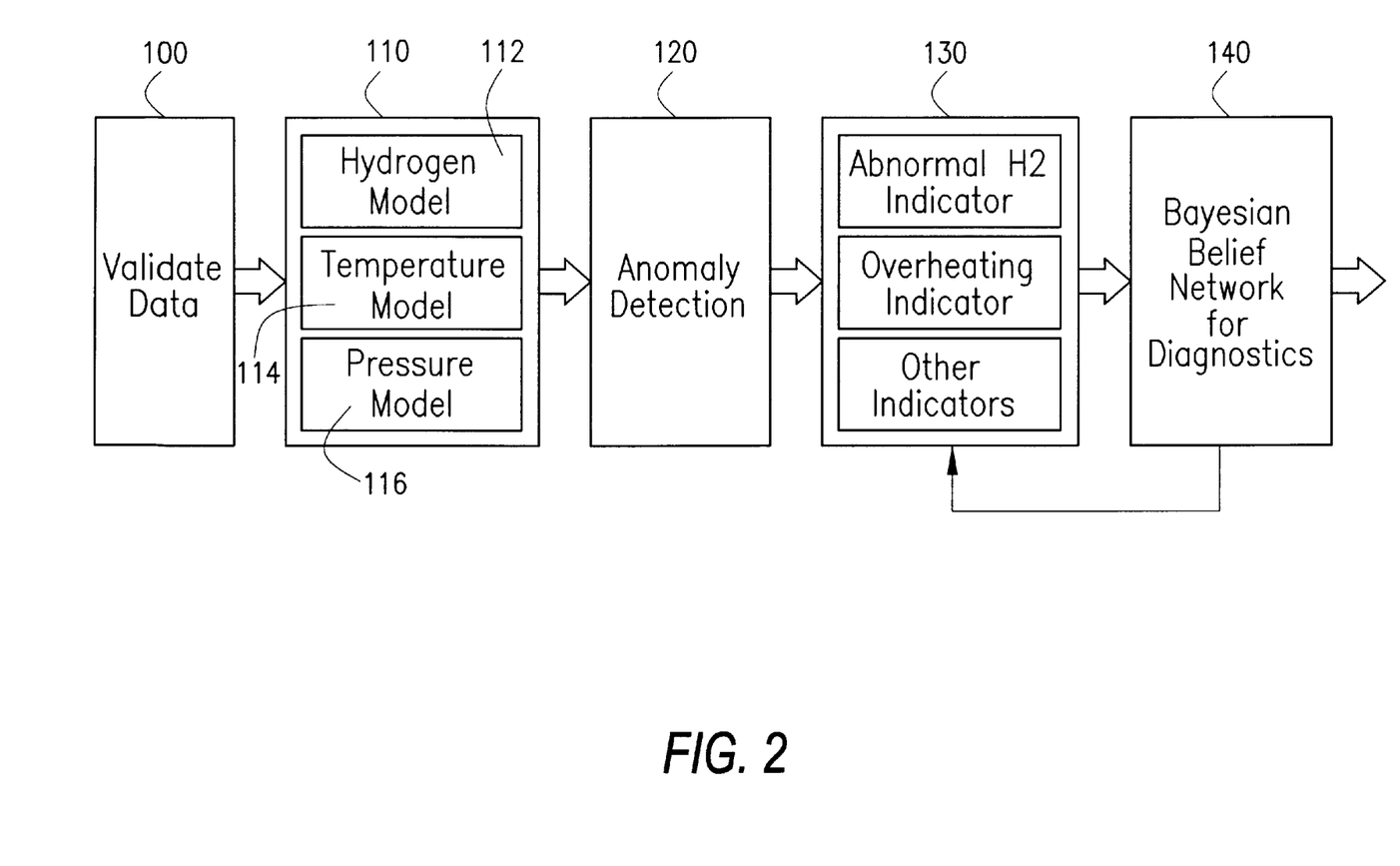
FIG. 2 is a flowchart of a diagnostic determining routine of the preferred embodiment.

FIG. 2 is a flowchart of a diagnostic determining routine in accordance with the preferred embodiment. The routine can be in the form of software stored in memory device 44and written in any appropriate language or code that can be read by CPU 42. For example, the software routine can be written in Basic, C++, or the like. Output signals, i. e. sensor data, from D/A 54 are representative of parameters of equipment 20 and are input to processor 40 over bus 70. The sensor data is first subjected to validation step 100 to determine if the corresponding sensors are working properly. For example, validation step 100 can include a step of comparing the sensor data to predetermined minimum and maximum thresholds that correspond to possible (although not necessarily desirable) values of the parameters sensed by sensors 28a–28f. For example if the sensor data corresponding to sensor 28b (a temperature sensor) indicates a temperature higher or lower than a possible oil temperature, for example lower than an ambient temperature or much higher than the temperature rating of components 22, it can be assumed that the sensor 28a is not working properly. Also, validation step 100 can include a step of checking for impossible fluctuations in the value indicated by the sensor data which are indicative of an intermittent problem in sensor 28a. Validation step 100 is conducted in a similar manner for each of sensors 28a–28f. If one of the sensors 28a–28f is indicated as not functioning properly in validation step 100, an appropriate error message is displayed on display 62 or on a remote display or otherwise logged or communicated to an operator or a remote computer or the like. Data from a defective sensor can be ignored until the sensor is repaired or replaced. Alternatively, the parameter measured by the defective sensor can be calculated by one of the models in the manner described below.

The routine then advances to calculating step 110 in which the various parameters are calculated based on other sensed parameters in accordance with models developed for the particular parameter in equipment 20. For example a hydrogen model is an algorithm that calculates the theoretical value of molecular hydrogen ($H_2$) in fluid F of equipment 20 based on equipment configuration information, i. e the size, relative dimensions, components, type of fluid, etc. of equipment 20. The preferred embodiment includes hydrogen model 112, temperature model 114, and pressure model 116. Any of various known models can be used for each parameter. For example the "MIT Hydrogen Model" developed at the Massachusetts Institute of Technology can be used as hydrogen model 112. The MIT Hydrogen Model uses the following equation:

$$H_2[k] = \alpha + \beta \times T_{topoil}[k] + \gamma \times (T_{topoil}[k])^2$$

where:
  $k \rightarrow$ time measurement index,
  $H_2[k] \rightarrow$ calculated value of molecular hydrogen at each index interval;
  $T_{topoil}[k] \rightarrow$ measured topoil temperature at each index;
  $\alpha \rightarrow$ molecular hydrogen constant;
  $\beta \rightarrow$ molecular hydrogen first order coefficient; and
  $\gamma \rightarrow$ molecular hydrogen second order coefficient.

Similarly, the "MIT Temperature Model" can be used as temperature model 114 employing the following equation:

$$\Theta_{top}[k] = \frac{T_o}{T_o + \Delta t}\Theta_{top}[k-1] + \frac{\Delta t}{T_o + \Delta t}(\Theta_{amb}[k] + \Theta_u[k])$$

where:
  $k \rightarrow$ time measurement index;
  $\Theta_{top}[k] \rightarrow$ calculated top oil temperature at each index interval;
  $\Theta_{amb}[k] \rightarrow$ measured ambient temperature at each index interval;
  $\Delta t \rightarrow$ sampling frequency;
  $\Theta_u[k] \rightarrow$ ultimate top oil rise for current load L of each index interval; and
  $T_o \rightarrow$ oil time constant calculated from various transformer physical properties.

Any of various known pressure models can be used. The models are configured (i. e., the constants, and coefficients are calculated) in accordance with the particular physical characteristics of electrical equipment 20. For example, the rated load, the average conductor temperature rise over top oil, the top oil rise, the load loss ratio, the cooling characteristics, the loss, the thermal capacity, the weight of components 22, the weight of containment vessel 24, and the fluid capacity of electrical equipment 20 can be considered in a known manner to develop the appropriate models.

Once the various values for each parameter have been calculated by processor 40 in accordance with the models in step 110, the calculated values of each parameter are compared to the measured values, i. e. the sensor data, of the corresponding parameter in anomaly detection step 120. If the measured values are within a prescribed tolerance or range of the calculated value, no anomaly for that parameter is detected and no alarm is sounded. On the other hand, if the measured value of a particular parameter is not within the prescribed tolerance or range, an alarm can be sounded on display 62, a separate alarm device, a remote display or the like or otherwise logged or communicated, thus providing a preliminary status indication.

In step 130, the differences between the measured and calculated parameter values are applied as indicators of a causal network. The causal network is part of the routine and thus can be stored in memory device 44. The causal network can be developed in advance in the manner described below. Each causal network has a cause and effect relationship between a plurality of nodes, wherein some of the nodes represent root causes associated with failures in electrical equipment 20, i. e. failure modes, and some of the nodes represent observable manifestations of the failure modes. Each of the failure modes in the causal networks has a prior probability indicating the likelihood of the particular failure.

Each of the nodes in the causal network also has conditional probability information representing the strength of the relationships of the manifestation node to its failure mode, i. e. the cause and effect relationships between failures and observable symptoms for electrical equipment 20. Thus, in order to develop the causal network there has to be an understanding of how each component in fluid-filled electrical equipment operates and of the observable symptoms of each failure mode. Some of the possible failure modes that electrical equipment 20 may be subject to are failure of pump 26(including failure of the motor and damage to the fan blade), leakage of containment vessel 24, failure of component 22, failure of insulation on component 22, an overload condition, dielectric breakdown of fluid F, and a radiator leak.

Figure 3:
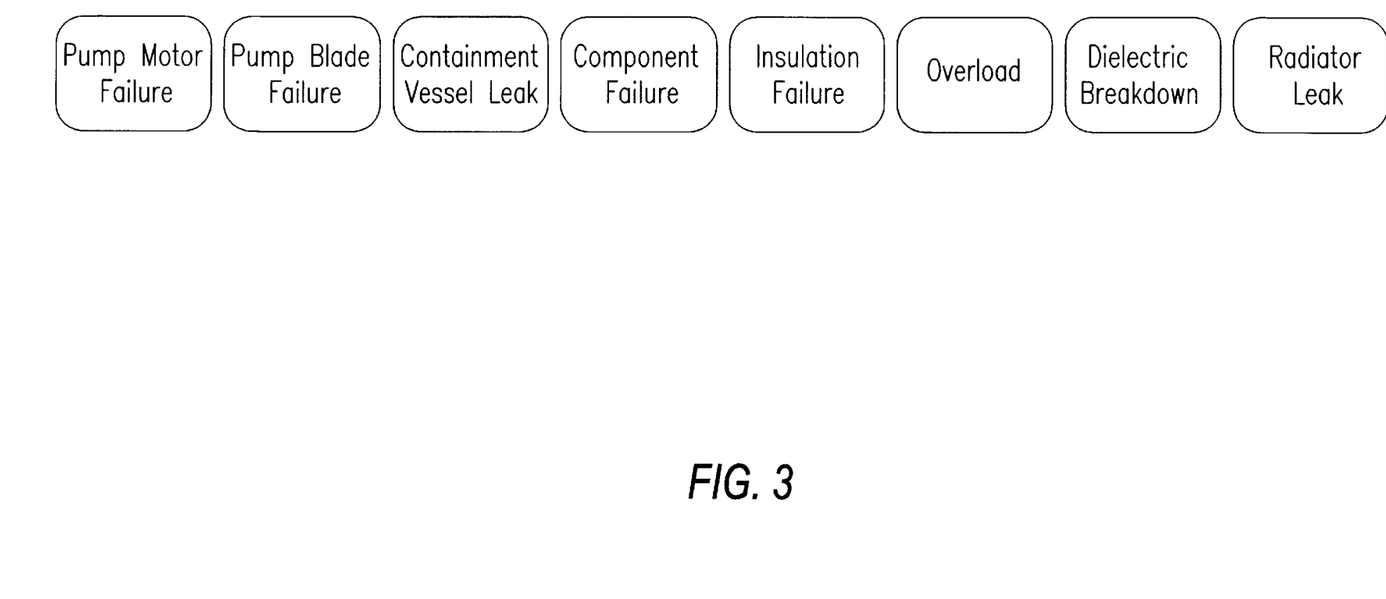
FIG. 3 is a graphical representation of possible failure modes of the preferred embodiment.

After all of the possible failure modes have been identified for electrical equipment 20, the causal network for electrical equipment 20 is developed. FIG. 3 illustrates the above-identified failure modes for electrical equipment 20. These failure modes are intended to be exemplary and the list is not all-inclusive. Each of the failure modes is designated as a failure mode node, or a cause, and is represented as a box with rounded corners. Each cause has some higher level effect on electrical equipment 20. It is also possible that several causes may have the same effect. At some point, an effect manifests itself such that it can be measured or observed. When the state of a single observable symptom or the state of several observable symptoms is unique to a single cause, then it will be possible to unambiguously identify the problem.

Figure 4:
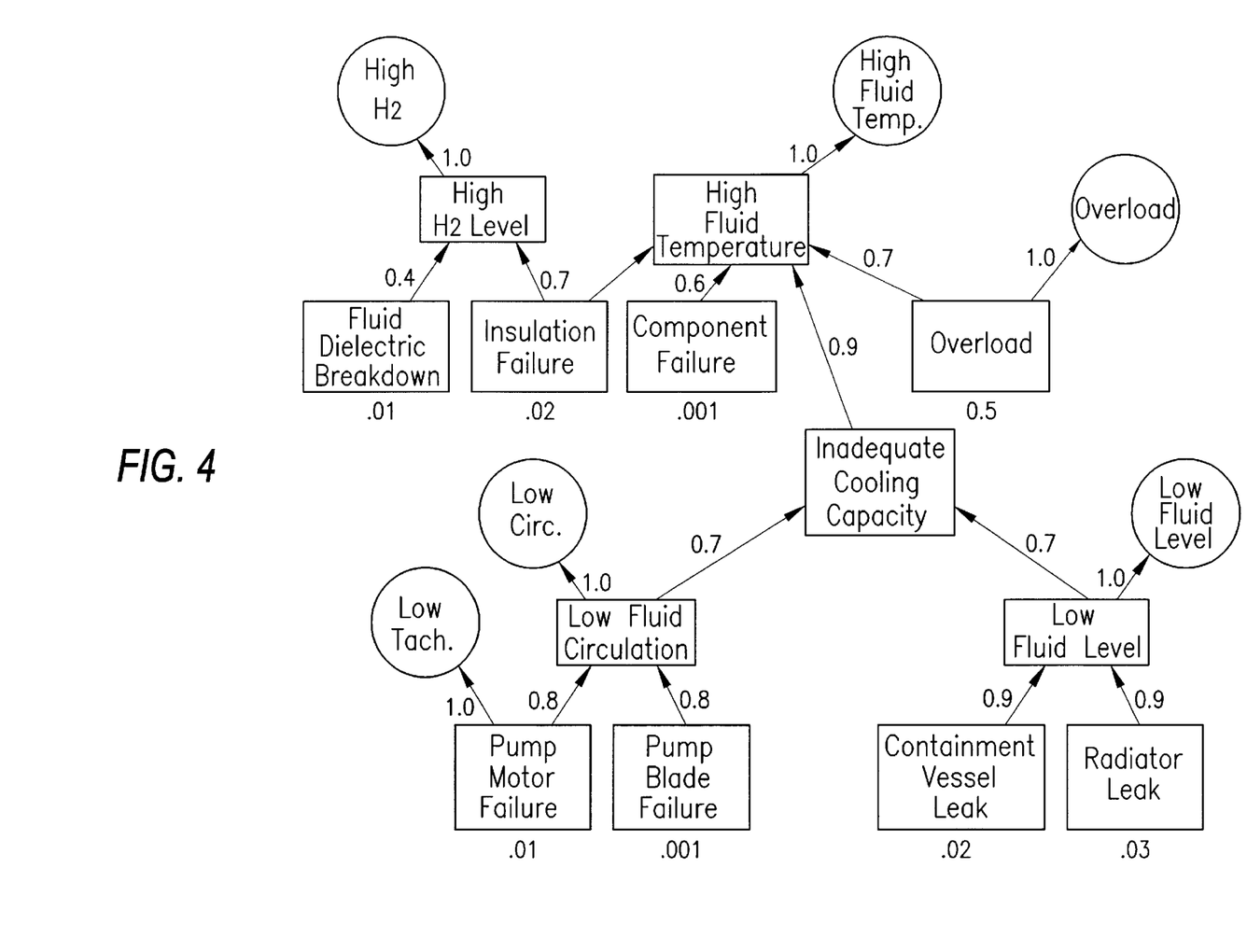
FIG. 4 is a graphical representation of a causal network for the failure modes of FIG. 3.

FIG. 4 illustrates an example of the cause and effect relationships for each of the failure modes identified in FIG. 3, i. e., a causal network for electrical equipment 20. The phrase "causal network" as used herein refers to a network, algorithm, or the like indicating potential failure, and their probability relationship to various manifestations. The cause and effect relationship between each of the nodes (failure modes and observable manifestations) is shown with an arrow pointing in the direction of the causality. In FIG. 4, the failure modes of pump motor failure and pump blade failure are each shown to have an effect that is characterized by the observable manifestation of low fluid circulation. The low circulation node is coupled to an indicator node, low circulation, that indicates whether the fluid circulation is low as measured by sensor 28e. The indicator node is a node that is always an effect that directly represents the value of a measured parameter, a calculated value of the parameter, or the difference between the measured parameter and the calculated value thereof and is represented by a circle.

The pump blade failure node, and the pump motor failure node are each shown to have an effect that is characterized with low fluid circulation through containment vessel 24, as indicated by the data from sensor 28e as compared to values calculated by pressure model 116 (in step 110 above). The containment vessel leak node is shown to have an effect that the fluid level will be low as indicated by fluid level sensor 28f in containment vessel 24. In addition, the pump motor failure mode is coupled to an indicator node that corresponds to the feedback, e. g. a tachometer, from pump 26. At a higher level, the effects of low fluid circulation and low fluid level have an effect on electrical equipment 20 that is characterized by inadequate cooling capacity because the fluid is not properly circulated through a radiator. This effect is coupled to an indicator that checks if the fluid temperature is above normal, as indicated by the difference between the temperature value calculated by temperature model 114 (in step 110 described above) and the temperature measured by temperature sensor 28b.

For each failure mode in the causal network, an initial conditional probability indicating the likelihood of a failure is assigned. The conditional probabilities are factors assigned to each failure mode that indicates the relative probability that the cause is present. FIG. 4 shows an example of conditional probabilities assigned to each of the failure modes for electrical equipment 20. The conditional probabilities are listed as decimal numbers under the corresponding failure mode node. Note that in cases where a component has multiple failure modes, the conditional probability of failure due to each failure mode is required. Also, note that the conditional probability magnitudes of failure mode nodes grouped together dictate the relative likelihood that a particular failure mode is the problem. For example according to the causal network of FIG. 4, if there was low circulation of fluid F, then it would be predicted that a pump motor failure (conditional probability of 0.1) was ten times more likely to be the cause of low fluid circulation than a pump blade failure (conditional probability of 0.001).

After a conditional probability has been assigned to each of the failure modes, an edge probability estimating the strength of the relationship between the failure mode and a next level manifestation is assigned for each relationship. The edge probabilities, are listed in accordance with the line connecting the failure mode nodes with the manifestation nodes and represent the probability that the manifestations will exist, given that the failure mode is already known to exist. If all of the failure modes are independent, and if all of the failure modes do not exist, then the manifestation does not exist. In the preferred embodiment, a single parameter between 0 and 1 is used as an edge probability to represent the strength of the relationship (1 being indicative of a direct relationship or a "one-to-one" relationship) however any indication representing the relationship between the failure mode node and the manifestation node can be used.

As an example, a leak in containment vessel 24 will result in a detected effect of low level of fluid F 90% of the time, as indicated by an edge probability of 0.9. The other 10% of the time, the leak will be too slow to affect fluid level significantly. Note that the conditional probability information is derived from the edge probability information. This information can be determined experimentally or mathematically.

The causal network described above, is applied in step 130 of FIG. 2 and used to determine the operating status of electrical equipment 20. The indicators of the causal network, i. e. the parameters measured by sensors 28a–28f and the differences between these parameters and calculated values thereof yielded by models 112, 114 and 116, are evaluated in accordance with the conditional probability information and the edge probability information. Processor 40 continually recalculates the probabilities of the causal networks according to the status of the mapped indicators, as indicated by sensors 28a–28f and the appropriate models. In particular, the probabilities are recalculated in step 140 using a known belief network solution algorithm, such as a Bayesian Belief Network, and fed back to the causal network of step 130. For example, if there is low, fluid circulation detected by sensor 28e and the tachometer of pump 26 indicates normal pump-motor status, the probabilities are adjusted to increase the likelihood that there is a pump blade failure. Processor 40 then evaluates the recalculated probabilities in the causal network. In addition, processor 40 can provide a list of the most likely causes for any abnormality, as well as a list of corrective actions to be taken to correct or avoid failure. The probabilities are recalculated by the belief network based on information learned from the causal network using the previous probabilities. The recalculations can be based on known inference techniques, influence techniques, or Bayes' theorem.

The routine illustrated in FIG. 2 is conducted in essentially a continuous manner in the preferred embodiment. However, the process can be conducted in a periodic manner automatically, or upon request by an operator. The various constants and coefficients of the models are adjusted over time to compensate for normal behavioral changes in electrical equipment 20 over time. The constants and coefficients can be determined mathematically or experimentally in a known manner. The output of the causal network can be processed in any manner for diagnostics, prognostic, or the like. For example, status reports relating to operating characteristics of the electrical equipment can be generated, alarms can be effected, or the operation of the equipment can be adjusted.

The invention can be applied to any fluid-filled electrical equipment. Any desired parameters can be detected. Sensor data or signals can be processed in any way to provide indication of incipient faults prognostics, life assessment, maintenance schedules, fault root cause identification, or other status of the electrical equipment based on experimental or mathematical models. Additionally, the invention can provide performance characteristic evaluations such as utilization factors, load scheduling, efficiency, energy loss, power factor, harmonics, and on load tap changer performance.

The diagnostic device can be local, i. e closely situated with respect to the electrical equipment, or remote, i. e., located at a remote location with respect to the electrical equipment. Histories of the values of the various parameters as measured and as calculated, can be compiled to assist further in fault determination. The various sensors can be polled at regular intervals and the intervals can be increased at times of heavy load on the equipment or upon indication of an abnormal state of the equipment.

The invention has been described through a preferred embodiment. However, various modifications can be made without departing from the scope of the invention as defined by the appended claims.

What is claimed is:

1. An intelligent analysis apparatus for fluid-filled electrical equipment of the type having components surrounded by fluid, said apparatus comprising:

plural sensors adapted to be coupled to electrical equipment having a containment vessel configured to contain a fluid and at least one electrical component disposed in said containment vessel, said sensors being configured to output signals indicative of plural operating parameters of said electrical equipment; and a diagnostic device coupled to said sensors, said diagnostic device having a processor operative to determine operating characteristics of the electrical equipment based on at least one analytical model of the electrical equipment and the signals outputted by said sensors by applying values of parameters calculated by the at least one analytical model and values of parameters as indicated by the signals of said sensors in a causal network, wherein said diagnostic device compares a parameter calculated by the at least one analytical model with a corresponding measured parameter and uses a result of the comparison as an indicator in the causal network, and further wherein probabilities of the causal network are updated based on the probability of the indicators obtained from the analytical model or sensed parameters; and still further wherein the variables of the at least one analytical model are adjusted over time in correspondence to acceptable behavioral changes of the electrical equipment over time.

2. An apparatus as recited in claim 1, wherein said sensors comprise a temperature sensor configured to output a signal indicative of fluid temperature inside the containment vessel of the electrical equipment, a gas sensor configured to output a signal indicative of gas content of fluid inside the containment vessel of the electrical equipment, a load sensor configured to output a signal indicative of the electrical load on the electrical equipment, and a pressure sensor configured to output a signal indicative of pressure in the containment vessel of the electrical equipment.

3. An apparatus as recited in claim 2, wherein said gas sensor is configured to output a signal indicative of a hydrogen content of fluid inside the containment vessel.

4. An apparatus as recited in claim 3, wherein the at least one analytical model comprises a temperature model and a hydrogen model.

5. An apparatus as recited in claim 4, wherein the at least one analytical model further comprises a pressure model.

6. An apparatus as recited in claim 2, wherein said gas sensor is configured to output a signal indicative of at least one of hydrogen, carbon monoxide, carbon dioxide, oxygen, nitrogen, hydrocarbons, and hydrocarbon derivatives.

7. An apparatus as recited in claim 1, wherein said sensors are adapted to be disposed inside the containment vessel, said apparatus further comprising means for conducting the signals from said sensors to said processor.

8. An apparatus as recited in claim 1, said diagnostic device further comprising a user interface module having a display for displaying an indication of the operating characteristics of the electrical equipment and an input device for permitting a user to input at least one of data and commands to said diagnostic device.

9. An apparatus as recited in claim 1, wherein said processor comprises a computer having a CPU and a memory device.

10. An apparatus as recited in claim 1, wherein the electrical equipment is a transformer.

11. An intelligent analysis apparatus for fluid-filled electrical transformers, said apparatus comprising:

plural sensors adapted to be coupled to a transformer having a containment vessel configured to contain a fluid and coil disposed in said containment vessel, said sensors being configured to output signals indicative of plural operating parameters of the transformer; and a diagnostic device coupled to said sensors, said diagnostic device having a processor operative to determine operating characteristics of the transformer based on at least one analytical model of the transformer and the signals outputted by said sensors by applying values of parameters calculated by the at least one analytical model and values of parameters as indicated by the signals of said sensors in a causal network, wherein said diagnostic device compares a parameter calculated by the at least one analytical model with a corresponding measured parameter and uses a result of the comparison as an indicator in the causal network, and further wherein probabilities of the causal network are adjusted based on the probability of the indicators obtained from the analytical model or sensed parameters; and still further wherein the at least one analytical model is adjusted over time in correspondence to acceptable behavioral changes of the transformer over time.

12. An apparatus as recited in claim 11, wherein said sensors comprise a temperature sensor configured to output a signal indicative of fluid temperature inside said containment vessel, a gas sensor configured to output a signal indicative of gas content of fluid inside said containment vessel, a load sensor configured to output a signal indicative of the electrical load on the transformer and a pressure sensor configured to output a signal indicative of pressure in said containment vessel.

13. An apparatus as recited in claim 12, wherein said gas sensor is configured to output a signal indicative of a hydrogen content of fluid inside said containment vessel.

14. An apparatus as recited in claim 13, wherein the at least one analytical model comprises a temperature model and a hydrogen model.

15. An apparatus as recited in claim 14, wherein the at least one analytical model comprises a pressure model.

16. An apparatus as recited in claim 12, wherein said gas sensor is configured to output a signal indicative of at least one of hydrogen, carbon monoxide, carbon dioxide, oxygen, nitrogen, hydrocarbons, and hydrocarbon derivatives.

17. An apparatus as recited in claim 11, wherein said processor is disposed outside of said containment vessel and said sensors are disposed inside said containment vessel, said system further comprising means for conducting signals from said sensors to said processor.

18. An apparatus as recited in claim 11, said diagnostic device further comprising a user interface module having a display for displaying an indication of the operating characteristics of the transformer and an input device for permitting a user to input at least one of data and commands to said diagnostic device.

19. An apparatus as recited in claim 11, wherein said processor comprises a computer having a CPU and a memory device.

20. An intelligent analysis apparatus for fluid-filled electrical equipment of the type having components surrounded by fluid, said apparatus comprising:

sensing means for sensing plural operating parameters of electrical equipment having a containment vessel configured to contain a fluid and at least one electrical component disposed in said containment vessel and for outputting signals indicative of the plural operating parameters of said electrical equipment; and diagnostic means for determining operating characteristics of the electrical equipment based on at least one analytical model of the electrical equipment and the signals outputted by said sensing means by applying values of parameters calculated by the at least one analytical model and values of parameters as indicated by the signals of said sensing means in causal network, wherein said diagnostic means comprises means for comparing a parameter calculated by the at least one analytical model with a corresponding measured parameter and means for using a result of the comparison as an indicator in the causal network, and further wherein said diagnostic means comprises means for adjusting probabilities of the causal network based on the probability of the indicators obtained from the analytical model or sensed parameters; and still further wherein said diagnostic means comprises means for adjusting variables of the at least one analytical model over time in correspondence to acceptable behavioral changes of the electrical equipment over time.

21. An apparatus as recited in claim 20, wherein said sensing means comprises temperature sensing means for outputting a signal indicative of fluid temperature inside said containment vessel, gas sensing means for outputting a signal indicative of gas content of fluid inside said containment vessel, load sensing means for outputting a signal indicative of the electrical load on the electrical equipment and pressure sensing means for outputting a signal indicative of pressure in said containment vessel.

22. An apparatus as recited in claim 21, wherein said gas sensing means comprises means for outputting a signal indicative of a hydrogen content of fluid inside said containment vessel.

23. An apparatus as recited in claim 22, wherein the at least one analytical model comprises a temperature model and a hydrogen model.

24. An apparatus as recited in claim 23, wherein the at least one analytical model comprises a pressure model.

25. An apparatus as recited in claim 21, wherein said gas sensing means comprises means for outputting a signal indicative of an amount of at least one of hydrogen, carbon monoxide, carbon dioxide, oxygen, nitrogen, hydrocarbons, and hydrocarbon derivatives.

26. An apparatus as recited in claim 20, further comprising means for conducting signals from said sensor means to said processor.

27. An apparatus as recited in claim 20, said diagnostic means further comprising user interface means for displaying an indication of the operating characteristics of the electrical equipment and input means for permitting a user to input at least one of data and commands to said diagnostic means.

28. An apparatus as recited in claim 20, wherein said diagnostic means comprises a computer having a CPU and a memory device.

29. An apparatus as recited in claim 20, wherein the electrical equipment comprises a transformer.

30. A method for intelligent analysis of fluid-filled electrical equipment of the type having components surrounded by fluid, said method comprising the steps of:

coupling plural sensors to electrical equipment having a containment vessel configured to contain a fluid and at least one electrical component disposed in said containment vessel;

sensing plural operating parameters of the electrical equipment with the sensors;

generating signals indicative of the plural operating parameters of the electrical equipment sensed in said sensing step; and determining operating characteristics of the electrical equipment based on at least one analytical model of the electrical equipment and the signals generated in said generating step by applying values of parameters calculated by the at least one analytical model and values of parameters as indicated by the generated in said generating step in a causal network, wherein said determining step comprises the steps of comparing a parameter calculated by the at least one analytical model with a corresponding measured parameter as indicated by signals in said generating step and using a result of said comparing step as an indicator in the causal network, and further wherein said determining step comprises the step of adjusting the probabilities of the causal network based on the probability of the indicators obtained from the analytical model or sensed parameters; and still further wherein said determining step comprises the step of adjusting variables of the at least one analytical model over time in correspondence to acceptable behavioral changes of the electrical equipment over time.

31. A method as recited in claim 30, wherein said sensing step comprises the steps of sensing temperature inside the containment vessel, sensing gas content of fluid inside the containment vessel, sensing the electrical load on the electrical equipment and sensing pressure in the containment vessel.

32. A method as recited in claim 31, wherein said step of sensing gas content comprises sensing a hydrogen content of fluid inside the containment vessel.

33. A method as recited in claim 32, wherein the at least one analytical model used in said determining step comprises a temperature model and a hydrogen model.

34. A method as recited in claim 33, wherein the at least one analytical model comprises a pressure model.

35. A method as recited in claim 31, wherein said step of sensing gas content comprises sensing at least one of hydrogen, carbon monoxide, carbon dioxide, oxygen, nitrogen, hydrocarbons, and hydrocarbon derivatives.

36. A method as recited in claim 30, further comprising the steps of displaying an indication of the operating characteristics of the electrical equipment and inputting at least one of data and commands.

\* \* \* \* \*